United States Patent [19]
Derner et al.

[11] Patent Number: 6,111,803
[45] Date of Patent: Aug. 29, 2000

[54] REDUCED CELL VOLTAGE FOR MEMORY DEVICE

[75] Inventors: Scott J. Derner; Patrick J. Mullarkey, both of Meridian, Id.

[73] Assignee: Micron Technology, Inc., Boise, Id.

[21] Appl. No.: 09/385,478

[22] Filed: Aug. 30, 1999

[51] Int. Cl.$^7$ ...................................................... G11C 7/00
[52] U.S. Cl. ........................... 365/205; 365/207; 365/208
[58] Field of Search .................................... 365/205, 207, 365/208

[56] References Cited

U.S. PATENT DOCUMENTS

| 5,726,931 | 3/1998 | Zagar et al. ............................. 365/207 |
| 5,732,033 | 3/1998 | Mullarkey et al. ...................... 365/201 |

OTHER PUBLICATIONS

Mikio Asakura, et al., *A 34ns 256Mb DRAM with Boosted Sense–Ground Scheme*, 1994 IEEE International Solid State Circuits Conference (ISSCC94), Paper TA 8.2, Feb. 17, 1994 (3 pages).

Masaki Tsukude, et al., *Automatic Voltage–swing Reduction (AVR) Scheme for Ultra Low Power DRAMs*, 1994 Symposium on VLSI Circuits Digest of Technical Papers, Apr. 1994, pp. 87–88.

*Primary Examiner*—Trong Phan
*Attorney, Agent, or Firm*—Knobbe, Martens Olson & Bear, LLP

[57] ABSTRACT

A memory cell stores a logical "1" at a reduced voltage of $V_{CC}/2$ with a cell-plate voltage of $V_{CC}/4$. A pair of complementary digit lines are initially biased to $V_{CC}/2$. Because the digit lines are biased to $V_{CC}/2$ and a "1" is stored as $V_{CC}/2$, no voltage delta appears on the digit line when the access transistor is turned on. A sense amplifier is biased to favor a logical "1" if there is no voltage differential between the digit lines in order for the data sense amplifier to correctly interpret having no voltage delta as a logical "1". The row address is used to determine which digit line has the cell charge and which digit line is the reference. Using this approach, the gate voltages of the access device and of the isolation device do not have to be higher than $V_{CC}$. The use of lower cell voltage produces immediate gains in static refresh times due to the reduced leakage currents.

37 Claims, 7 Drawing Sheets

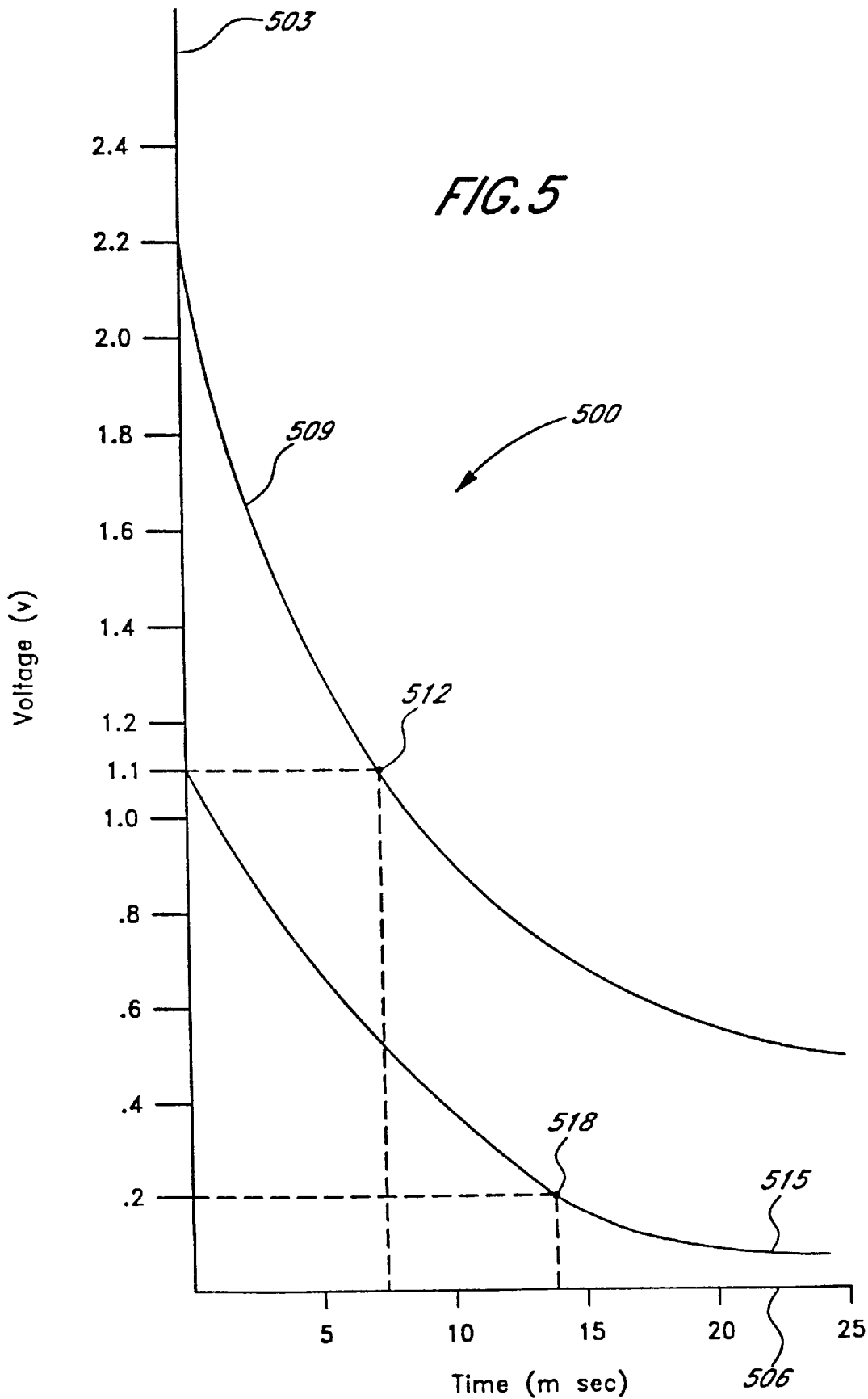

REDUCED CELL VOLTAGE FOR MEMORY DEVICE

BACKGROUND OF THE INVENTION

1. Field of the Invention

The present invention relates generally to semiconductor integrated circuit memory devices comprising arrays of data storage cells. More specifically, the present invention relates to a method and apparatus for reducing the cell voltage required for a logical "1" to be detected.

2. Description of the Related Art

Modern electronic systems typically include a data storage device such as a dynamic random access memory (DRAM), static random access memory (SRAM) or other conventional memory devices. The memory device stores data in large arrays of memory cells. Each cell conventionally stores a single bit of data (a logical "1" or a logical "0") and can be individually accessed or addressed. A data bit is output from a memory cell during a read operation and a data bit is stored into a memory cell during a write operation.

In a standard read or write operation, a column decoder and a row decoder translate address signals into a single intersection of a row (wordline) and column (digit line) within the memory array. This function permits a data bit to be read from the memory cell at that location or for data bit to be placed in the cell. The processing of data is dependent on the time it takes to store or retrieve individual bits of data in the memory cells. Storing and retrieving the bits of data are controlled generally by a microprocessor, whereby data are passed to and from the memory array through a fixed number of input/output (I/O) lines and I/O pins. The accuracy of sensing data is further dependent on the magnitude of charge stored in a memory cell and the capacitance inherent in the integrated circuit. Typically, a logical "1" is stored in a memory cell as $V_{CC}$ on a storage node side of a capacitor with a potential of $V_{CC}/2$ on the common plate of the memory cell capacitor. When reading a logical "1" from the capacitor, the row line turns on the access transistor between the storage node side of the capacitor and the digit line. The charge from the storage node dumps onto the digit line and brings the voltage of the digit line up slightly above the equilibrium level of $V_{CC}/2$ or approximately $V_{CC}/2$ plus 50 mV. The reason that the cell only brings the digit up slightly is because of the large capacitance of the digit line with respect to the cell capacitance. Thus, the same charge that raises the storage node of the cell to $V_{CC}$ can only move the digit lines slightly above their equilibrium level of $V_{CC}/2$.

The same principles apply to dumping a "0" onto a digit line. Even though the storage node side of the cell is at ground when the row line turns on the access gate to the cell, very little charge transferred from the digit line is needed to cause the digit line and the cell to be at the same level. This new level is slightly lower than the equilibrium level of $V_{CC}/2$ of the digit line, or approximately $V_{CC}/2$ minus 50 mV.

A sense amplifier uses the difference between the digit line having the memory cell dump and a reference digit line that remains at the equilibrium level to determine which line to pull up to $V_{CC}$ and which line to pull down to ground. The accuracy of the sensing operation is thus dependent on the signal clarity between sensing $V_{CC}/2$ plus 50 mV and $V_{CC}/2$ minus 50 mV.

Because a logical "1" in a DRAM is stored as $V_{CC}$ on the cell, the use of a high voltage (VCCP) on the gate of the access transistor and on the gate of the isolation transistor is required. This high voltage may pose reliability problems as the gate oxide thickness continues to decrease. Also, a p-channel sense amplifier is needed to pull the $V_{CC}/2$ biased digit line up to $V_{CC}$ during a read to restore the charge in the cell. Static refresh is limited because the cell nitride has to be thick enough to withstand voltages of $V_{CC}/2$ across it, and the reverse junction leakage and sub-threshold leakage currents of the access transistor are increased by the use of $V_{CC}$ in the cell.

SUMMARY OF THE INVENTION

The present invention involves storing a logical "1" in a memory cell at a reduced voltage of $V_{CC}/2$ with a cell-plate voltage of $V_{CC}/4$. Two complementary digit lines are initially biased to $V_{CC}/2$. Because the digit lines are biased to $V_{CC}/2$ and a logical "1" is stored as $V_{CC}/2$, no voltage delta appears on the digit line when the access transistor is turned on. Therefore, a sense amplifier is biased to favor a logical "1" if there is no voltage differential between the digit lines in order for the data sense amplifier to correctly interpret having no voltage delta as a logical "1". The row address is used to determine which digit line has the cell charge and which digit line is the reference. Using this approach, the gate voltages of the access device and of the isolation device do not have to be higher than $V_{CC}$. The use of lower cell voltage produces immediate gains in static refresh times due to the reduced leakage currents.

One aspect of the present invention is a circuit using a reduced cell voltage. The circuit comprises a cell which stores a charge at a first voltage, the charge representing either a logical "1" or a logical "0". A first digit line is initially biased to a second voltage, with the first digit line being coupled to the cell. The first voltage is substantially equal to the second voltage when a logical "1" is stored in the cell. A second digit line is biased to a third voltage. A logic detector transfers the charge on the cell to the first digit line. The charge on the cell decreases the second voltage when a logical "0" is stored in the cell and does not substantially change the second voltage when a logical "1" is stored in the cell. A sense amplifier is in electrical communication with the first digit line and the second digit line. The sense amplifier compares the second voltage to the third voltage to determine the charge stored in the cell.

Another aspect of the present invention is a method of using a reduced cell voltage in a memory cell. The method comprises the steps of storing a logic level in the memory cell at a first voltage for a logical "1" and at a second voltage for a logical "0". A first digit line and a second digit line are biased to a reference voltage, with the first voltage being substantially equal to the reference voltage. The logic level in the memory cell is then transferred to the first digit line, and the voltage change of the first digit line is sensed. A logical "1" is output when there is substantially no voltage change on the first digit line, or a logical "0" is output when the voltage on the first digit line decreases. The method may also advantageously comprise the steps of detecting an equalization pulse and then returning the first digit line and the second digit line to the reference voltage.

Another aspect of the present invention is a memory device using a reduced voltage level in a memory cell to represent a logical "1". The memory device comprises a pair of complementary digit lines initially biased to a first voltage level. One of the pair of complementary digit lines is a reference digit line, and one of the pair of complementary digit lines is an active digit line. A memory access circuit transfers a charge stored in the memory cell to the active digit line of the pair of complementary digit lines. A sense amplifier detects the voltage level of the pair of complementary digit lines. The sense amplifier maintains the voltage level of a first of the pair of complementary digit lines at the first voltage level and decreases the voltage level of a second of the pair of complementary digit lines to a second voltage level. A logical "0" is output when the first of the pair of complementary digit lines is the reference digit line and a logical "1" is output when the second of a pair of complementary digit lines is the reference digit line.

Another aspect of the present invention is a circuit using a reduced cell voltage. The circuit comprises a cell which stores a charge at a first voltage, the charge representing either a logical "1" or a logical "0". A first digit line which is coupled to the cell is initially biased to a second voltage. The first voltage is substantially equal to the second voltage when a logical "1" is stored in the cell. A second digit line is biased to a third voltage. The circuit also comprises means for transferring the charge on the cell to the first digit line. The charge on the cell decreases the second voltage when a logical "0" is stored in the cell and does not substantially change the second voltage when a logical "1" is stored in the cell. A means for comparing the second voltage to the third voltage then determines the charge stored in the cell.

Another aspect of the present invention is a memory device using a reduced voltage level in a memory cell to represent a logical "1". The memory device comprises a pair of complementary digit lines initially biased to a first voltage level. One of the pair of complementary digit lines is a reference digit line and one of the pair of complementary digit lines is an active digit line. The memory device further comprises a means for transferring a charge stored in the memory cell to the active digit line and a means for maintaining the voltage level of a first of the pair of complementary digit lines at the first voltage level. The memory device also comprises a means for decreasing the voltage level of a second of the pair of complementary digit lines to a second voltage level. A logical "0" is indicated when the first of the pair of complementary digit lines is the reference digit line, and a logical "1" is indicated when the second of a pair of complementary digit lines is the reference digit line.

BRIEF DESCRIPTION OF THE DRAWINGS

These and other features and advantages of the invention will become more apparent upon reading the following detailed description and upon reference to the accompanying drawings, in which;

FIG. 5 is a graph showing the leakage rate of memory circuits using different values to represent a logical "1".

DETAILED DESCRIPTION OF THE PREFERRED EMBODIMENT

Figure 1A:
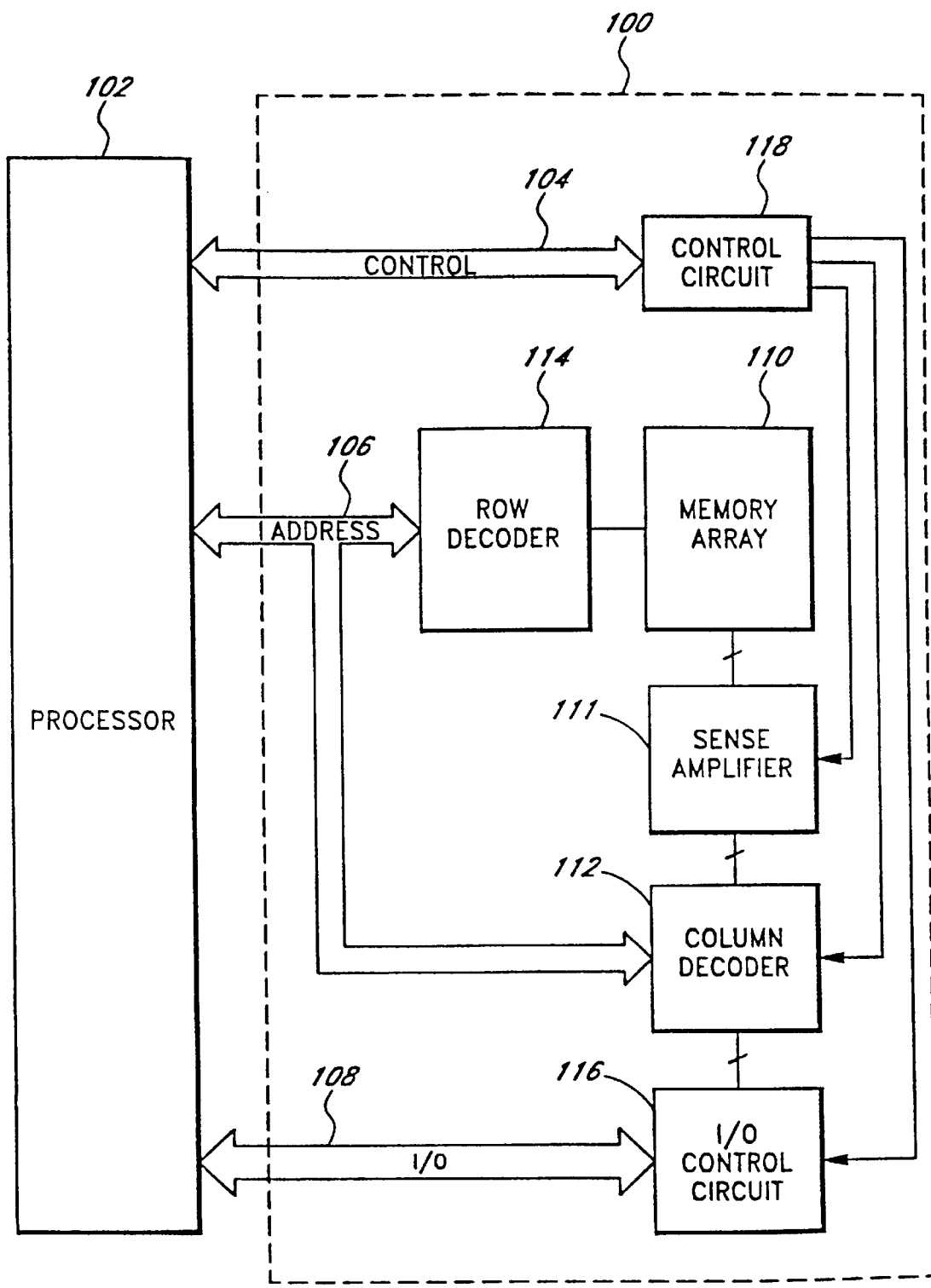
FIG. 1A is a block diagram illustrating a memory circuit according to the teaching of the present invention.

FIG. 1A is a block diagram illustrating a memory circuit 100 according to the present invention. The memory circuit 100 includes a memory array 110. A typical memory array 110 includes multiple rows of wordlines and multiple columns of bitlines. The intersections of the multiple rows of wordlines and the multiple columns of bitlines serve as the locations for multiple memory cells. The memory array 110 is coupled to a sense amplifier 111 and to a row decoder 114. The sense amplifier 111 is coupled to a column decoder 112. The column decoder 112 is additionally coupled to an input/output (I/O) control circuit 116. A plurality of address lines 106 interconnect a processor 102, the row decoder 114, and the column decoder 112. The processor 102 is connected to a control circuit 118 via a set of control lines 104. The processor 102 is coupled to the I/O control circuit 116 via a set of input/output (I/O) lines 108. In one embodiment, the memory array 110 includes a dynamic random access memory (DRAM) array.

Figure 1B:
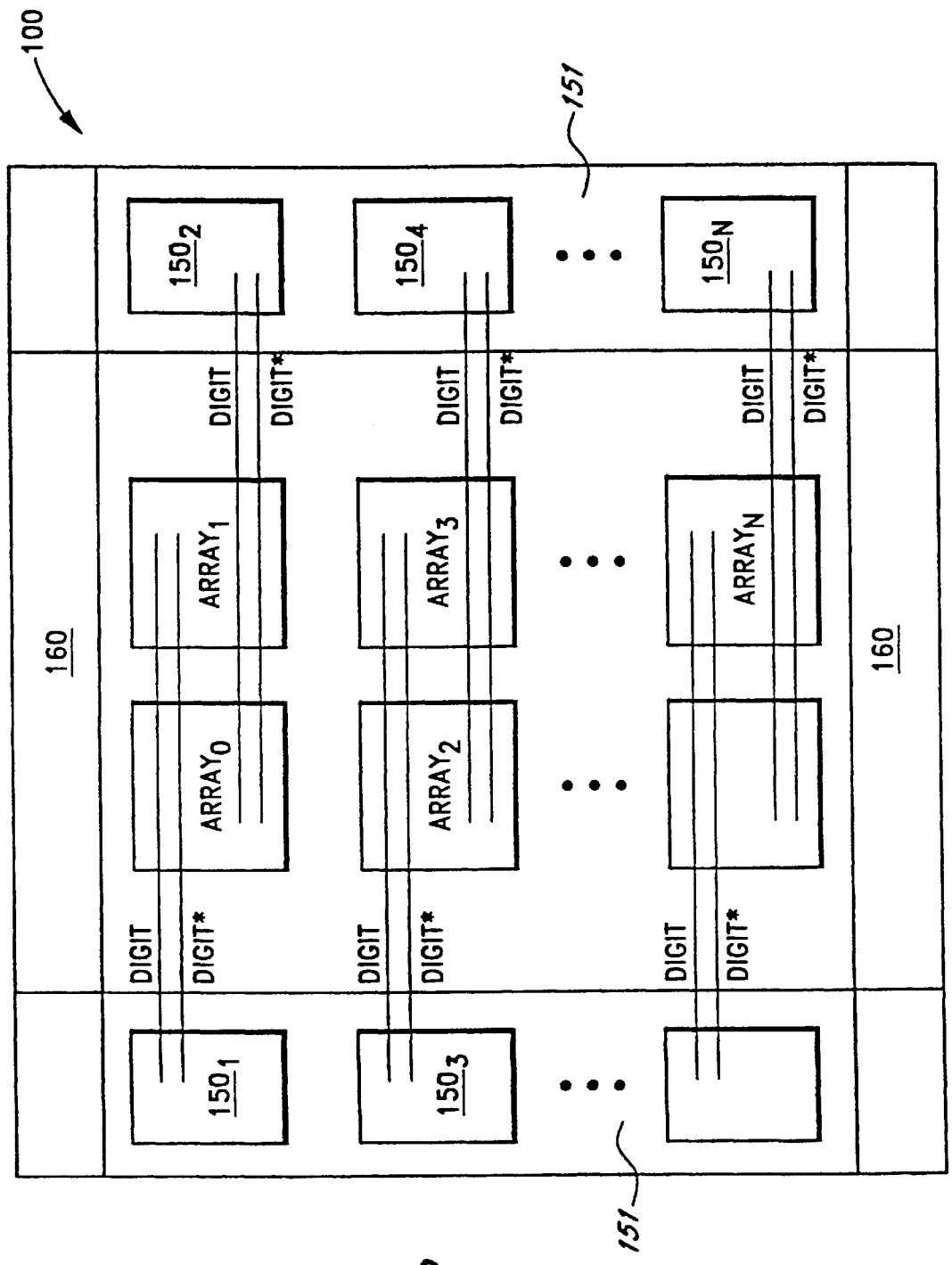
FIG. 1B is a block diagram illustrating in detail a portion of the memory circuit of FIG. 1A.

FIG. 1B is a block diagram illustrating in detail a portion of the memory circuit 100 of FIG. 1A. FIG. 1B illustrates that a typical memory circuit 100 includes multiple memory arrays, $ARRAY_0$, $ARRAY_1$, $ARRAY_2$, . . . , $ARRAY_N$, accessed by multiple complementary pairs of digit lines, DIGIT and DIGIT*. The multiple digit lines, DIGIT and DIGIT* are also coupled to the multiple sense amplifiers $150_1$, $150_2$, $150_3$, . . . $150_N$, located in sense amplifier gaps 151 of the memory circuit 100. FIG. 1B further illustrates the peripheral circuit regions 160 of the memory circuit 100. In one embodiment, the peripheral circuit regions 160 comprise such circuit device components as wordline drivers (not shown).

Figure 2:
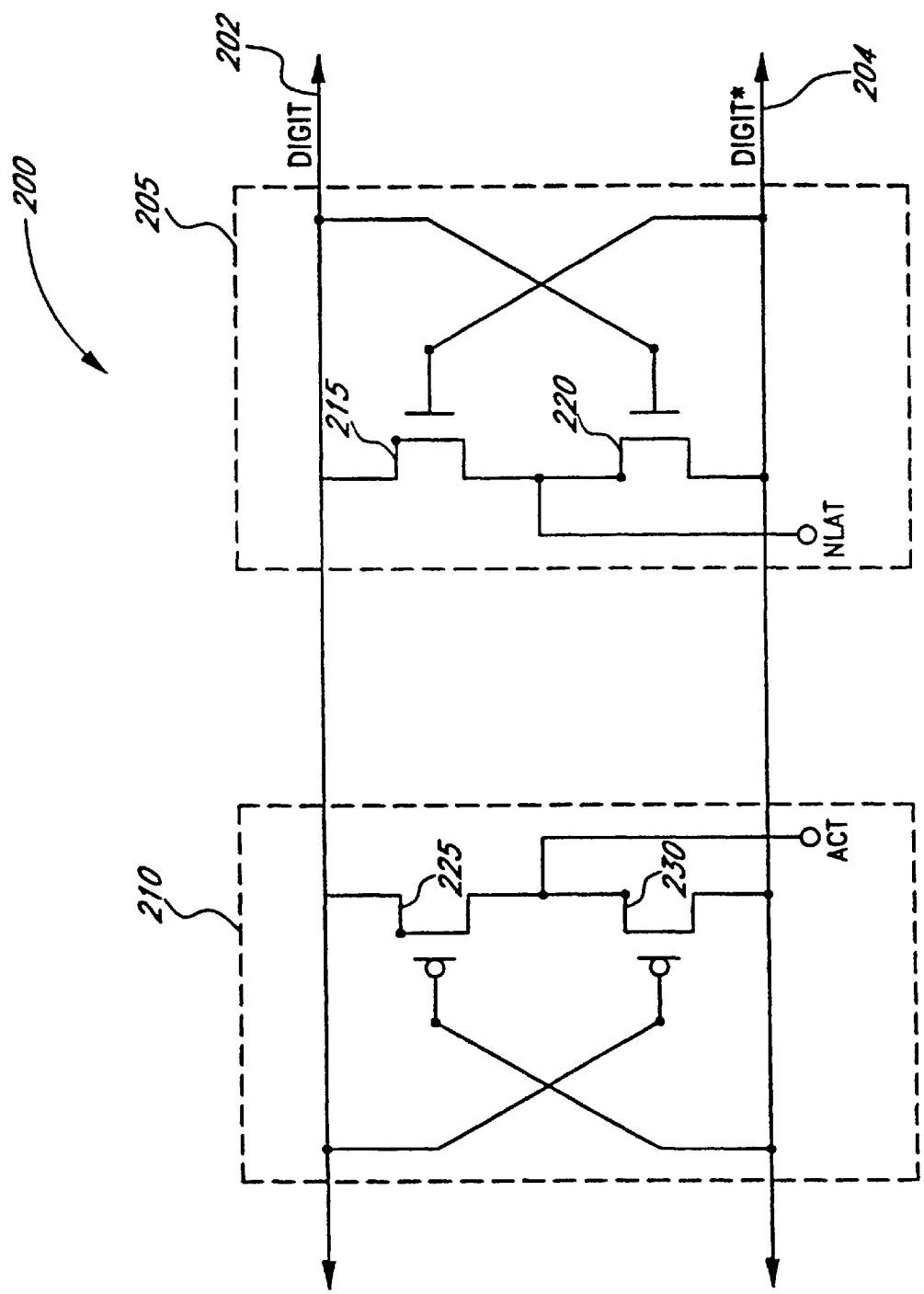
FIG. 2 is a schematic diagram of a sense amplifier for detecting voltage levels in memory circuits.

FIG. 2 presents a schematic diagram of a sense amplifier 200 suitable for illustrating conventional sense amplifier operation. Conventionally, a memory cell is read by raising the wordline to a voltage that is at least one transistor voltage threshold ($V_T$) above $V_{CC}$. After the wordline accesses the memory cell, the memory cell data is discharged onto the digit line 202 (DIGIT) to be sensed. The sensing function amplifies the digit line signal. That is, the differential voltage between the selected digit line 202 (DIGIT) and a reference digit line 204 (DIGIT*) is detected. Sensing is necessary to properly read the memory cell data and to refresh the memory cells.

FIG. 2 shows an exemplary cross-coupled n-channel metal-oxide semiconductor (nMOS) pair (n-sense amplifier) 205 and a cross-coupled p-channel metal-oxide semiconductor (pMOS) pair (p-sense amplifier) 210. The n-sense amplifier 205 includes a pair of transistors 215 and 220. The gate of the transistor 215 is connected to the reference digit line 204 (DIGIT*) and the gate of the transistor 220 is connected to the digit line 202 (DIGIT). The transistors 215 and 220 of the n-sense amplifier 205 have a common node labeled NLAT (for n-sense amplifier LATch). The other node of the transistor 215 is connected to the digit line 202 (DIGIT), and the other node of the transistor 220 is connected to the reference digit line 204 (DIGIT*). The transistors 215 and 220 of the p-sense amplifier 210 have a common node labeled ACT (for ACTive pull-up). The gate of the transistor 225 is connected to the reference digit line 204 (DIGIT*) and the gate of the transistor 230 is connected to the digit line 202 (DIGIT). The other node of the transistor 225 is connected to the digit line 202 (DIGIT), and the other node of the transistor 230 is connected to the reference digit line 204 (DIGIT*). The n-sense amplifier 205 and the p-sense amplifier 210 appear like a pair of cross-coupled inverters in which the ACT and NLAT node provide power and ground.

Initially, the NLAT node is biased to $V_{CC}/2$, and the ACT node is biased to signal ground. Both the digit line 202 (DIGIT) and the digit line 204 (DIGIT*) are initially equalized at $V_{CC}/2$. As a result, the transistors 215 and 220 of the n-sense amplifier 205 and the transistors 225 and 230 of the p-sense amplifier 210 are all off. When the memory cell is accessed, the charge in the memory cell is coupled to the digit line 202 (DIGIT). Although the digit line 202 receives the charge from the memory cell access, the other digit line 204 does not. Thus, the digit line 204 serves as a reference for the sensing operation. The sense amplifiers 205 and 210 are then fired sequentially. First, the n-sense amplifier 205 is fired. Then the p-sense amplifier 210 is fired.

The n-sense amplifier 205 is fired by lowering the voltage on NLAT toward ground. As the voltage difference between the NLAT node and the digit lines 202 and 204 approaches $V_T$, the nMOS transistor 215 or 220 in the cross-coupled nMOS pair whose gate is connected to the higher voltage digit line 202 or 204 begins to conduct. This conduction occurs first in the subthreshold region and then in the saturation region as the gate-to-source voltage exceeds $V_T$. For example, if a logical "1" was stored in the memory cell, the digit line 202 is at a higher voltage, causing the gate of the transistor 220 to be at a higher voltage than NLAT. The transistor 220 begins to conduct, causing the reference digit line 204 to be discharged toward the NLAT node voltage. As the NLAT node approaches ground potential, the reference digit line 204 is also brought to ground potential. The other nMOS transistor 215 does not conduct because its gate is driven by the reference digit line 204 which is being discharged toward ground. Note that parasitic coupling between the digit lines 202 and 204 and limited subthreshold conduction by the second transistor 215 results in some reduction in voltage on the higher voltage digit line 202, but the reduction in voltage is insignificant compared to the reduction of the voltage of the line 204 to ground potential.

After the n-sense amplifier 205 fires, the ACT node is brought toward $V_{CC}$ and activates the p-sense amplifier 210, which operates in a complementary fashion to the n-sense amplifier 205. When the reference digit line 204 approaches ground, the low voltage on the gate of the pMOS transistor 225, drives the pMOS transistor 225 in the cross-coupled pMOS pair into conduction. This conduction, again moving from subthreshold to saturation, raises the voltage of the digit line 202 toward the voltage on ACT, until the digit line 202 reaches $V_{CC}$. Therefore, the voltage on the digit line 202 approaches $V_{CC}$ as the reference digit line 204 approaches ground. Because the memory cell transistor remains on, the memory cell capacitor is refreshed during the sensing operation. The charge which the memory cell capacitor held prior to accessing is restored to a full level.

If a logical "0" was stored in the memory cell, the reference digit line 204 is at a higher voltage than the digit line and the transistor 215 initially conducts. This conduction causes the digit line 202 to be discharged toward the NLAT node voltage, which is discharging toward ground potential. Thus, when NLAT node voltage reaches ground, the digit line 202 is also brought to ground potential. The other nMOS transistor 220 does not conduct because its gate is driven by the digit line 202 which is being discharged toward ground. When the ACT node is charged toward $V_{CC}$, the p-sense amplifier 210 is activated. With the digit line 202 approaching ground, there is a sufficient voltage difference to drive the pMOS transistor 230 in the cross-coupled pMOS pair into conduction. The conduction of the transistor 240 charges the digit line 204 toward the voltage on the ACT node, until the digit line 204 ultimately reaches $V_{CC}$. Therefore, the reference digit line 204 reaches $V_{CC}$ and the digit line 202 reaches ground.

Figure 3:
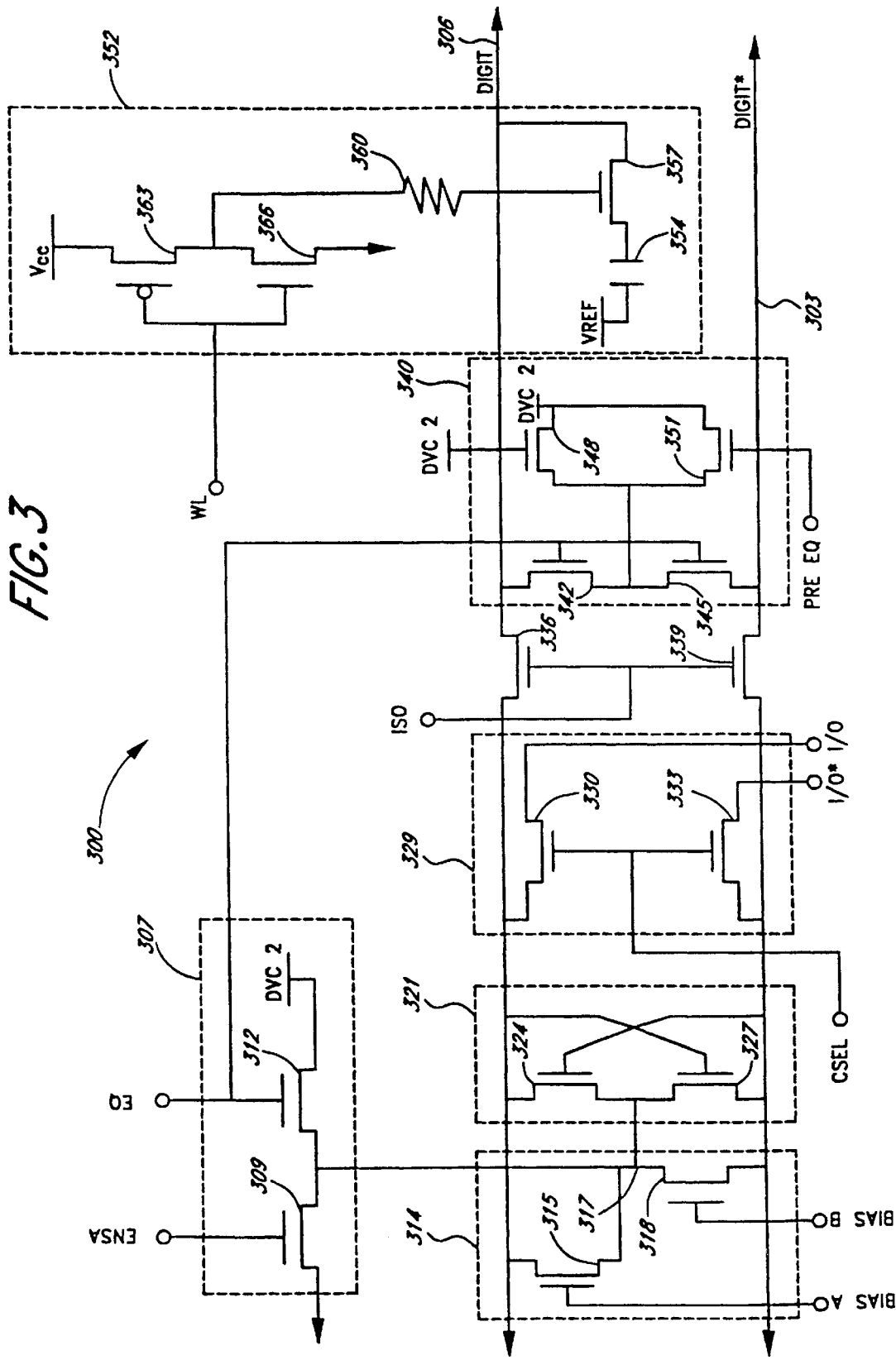
FIG. 3 is a schematic diagram of a memory circuit including a sense amplifier according to the present invention.

A circuit 300 illustrating a DRAM architecture which allows for reduced cell voltage and a biased sense amplifier is shown in FIG. 3. The circuit 300 comprises a pair of complementary digit lines 303 and 306 (DIGIT* and DIGIT), a control circuit 307, a biasing circuit 314, a sense amplifier 321, an input/output circuit 329, a digit line equalization circuit 340, and a data access circuit 352. The control circuit 307 is electrically coupled to both the biasing circuit 314 and the digit line equalization circuit 340. The control circuit 307 provides signals to control when the sensing begins and when the digit lines 303, 306 are returned to a reference voltage level. The control circuit 307 receives input signals ENSA and EQ. The control circuit 307 comprises a pair of transistors 309 and 312, each having a gate, a drain, and a source. The gate of the transistor 309 is connected to receive the input signal ENSA. The gate of the transistor 312 is connected to receive the input signal EQ and is connected to the digit line equalization circuit 340. The drain of the transistor 309 is connected to circuit ground. The sources of the transistors 309 and 312 are connected together and are further connected to a node 317 in the biasing circuit 314. The drain of the transistor 312 is connected to $V_{CC}/2$, also known as DVC2.

The biasing circuit 314 is coupled to the sense amplifier 321. The biasing circuit 314 provides biasing so that the sense amplifier 321 favors a logical "1" if there is no voltage differential between the digit lines 303, 306. The biasing circuit 314 receives input signals BIAS A and BIAS B. The biasing circuit 314 comprises a pair of transistors 315 and 318, each having a gate, a drain, and a source. The gate of the transistor 315 is connected to receive the input signal BIAS A. The gate of the transistor 318 is connected to receive the input signal BIAS B. The drains of the transistors 315 and 318 are connected together at the node 317. The source of the transistor 315 is connected to the digit line 306, and the source of the transistor 318 is connected to the digit line 303.

The sense amplifier 321 is coupled to the digit lines 303, 306 and to the biasing circuit 314. The sense amplifier 321 compares the voltages on the digit lines 303 and 306 to determine the difference between the digit line 306 having the memory cell charge dump and the reference digit line 303. Based upon the voltage difference, the sense amplifier 321 drives one of the digit lines 303, 306 to ground and maintains the other digit line at the equilibrium voltage. The sense amplifier 321 comprises a pair of transistors 324 and 327, each having a gate, a drain, and a source. The gate of the transistor 324 is connected to the reference digit line 303. The gate of the transistor 327 is connected to the digit line 306. The drains of the transistors 324 and 327 are connected together and are also connected to the node 317, which connects the sense amplifier 321 to the biasing circuit 314. The source of the transistor 324 is connected to the digit line 306, and the source of the transistor 327 is connected to the digit line 303.

The input/output circuit 329 is coupled to the digit lines 303, 306. The input/output circuit 329 accesses the charge on the digit lines 303, 306 and provides output signals so the memory cell charge may be read. The input/output circuit 329 receives an input signal CSEL and generates two output signals IO and IO*. The input/output circuit 329 comprises a pair of transistors 330 and 333, each having a gate, a drain, and a source. The gates of the transistors 330 and 333 are connected to the input signal CSEL. The drain of the transistor 330 is connected to receive the digit line 306, and the drain of the transistor 333 is connected to the digit line 303. The source of the transistor 330 is connected to the output signal IO, and the source of the transistor 333 is connected to the output signal IO*.

The transistors 336 and 339 form an isolation circuit. Each digit line 303, 306 has a first section and a second section. The isolation circuit provides a method of connecting or separating the sections of the digit lines 303, 306. The gates of the transistors 336 and 339 are connected to receive an input signal ISO. The drain of the transistor 336 is connected to a first section of the digit line 306, and the drain of the transistor 339 is connected to a first section of the digit line 303. The source of the transistor 336 is connected to a second section of the digit line 306, and the source of the transistor 339 is connected to a second section of the digit line 303. When a low voltage signal is applied to the input signal ISO, the low voltage is applied to the gates of the transistors 336 and 339 to turn off the transistors 336 and 339. When the transistors 336 and 339 are off, the sense amplifier 321 is isolated from the digit line equalization circuit 340 and from the data access circuit 352.

The digit line equalization circuit 340 is coupled to the digit lines 303, 306. The digit line equalization circuit 340 connects the digit lines 303, 306 together and rapidly pulls the digit lines 303, 306 to the reference voltage, or DVC2. The digit line equalization circuit 340 then maintains the digit lines 303, 306 at the reference voltage until a memory cell is accessed. The digit line equalization circuit 340 receives an input signal PRE EQ. The digit line equalization circuit 340 comprises four transistors 342, 345, 348, and 351, each having a gate, a drain, and a source. The gates of the transistors 342 and 345 are connected in the control circuit 307 to the gate of the transistor 312 and are connected to receive the input signal EQ. The source of the transistor 342 is connected to the digit line 306. The source of the transistor 345 is connected to the digit line 303. The drains of the transistors 342 and 345 are connected together and are also connected to the sources of the transistors 348 and 351. The drains of the transistors 348 and 351 are connected to a voltage source at the voltage DVC2. The gate of the transistor 348 is connected to a voltage source at the voltage DVC2, and the gate of the transistor 351 is connected to the input signal PRE EQ.

The data access circuit 352 is coupled to the digit line 306. The data access circuit 352 connects the digit line 306 to the memory cell and transfers the contents of the memory cell to the digit line 306. The data access circuit 352 receives an input signal WL. The data access circuit 352 comprises two n-channel transistors 357 and 366 and one p-channel transistor 363. Each transistor has a gate, a drain, and a source. The data access circuit 352 further comprises a memory cell 354 and a resistor 360. The gates of the transistors 363 and 366 are connected to receive the input signal WL. The drain of the transistor 363 is connected to a voltage source at $V_{CC}$. The drain of the transistor 366 is connected to ground. The source of the transistor 363 and the source of the transistor 366 are connected together and are both connected to a first terminal of the resistor 360. A second terminal of the resistor 360 is connected to the gate of the transistor 357. The source of the transistor 357 is connected to the digit line 306. The drain of the transistor 357 is connected to one terminal of the memory cell 354. A second terminal of the memory cell 354 is connected to a reference voltage $V_{REF}$.

Figure 4A:
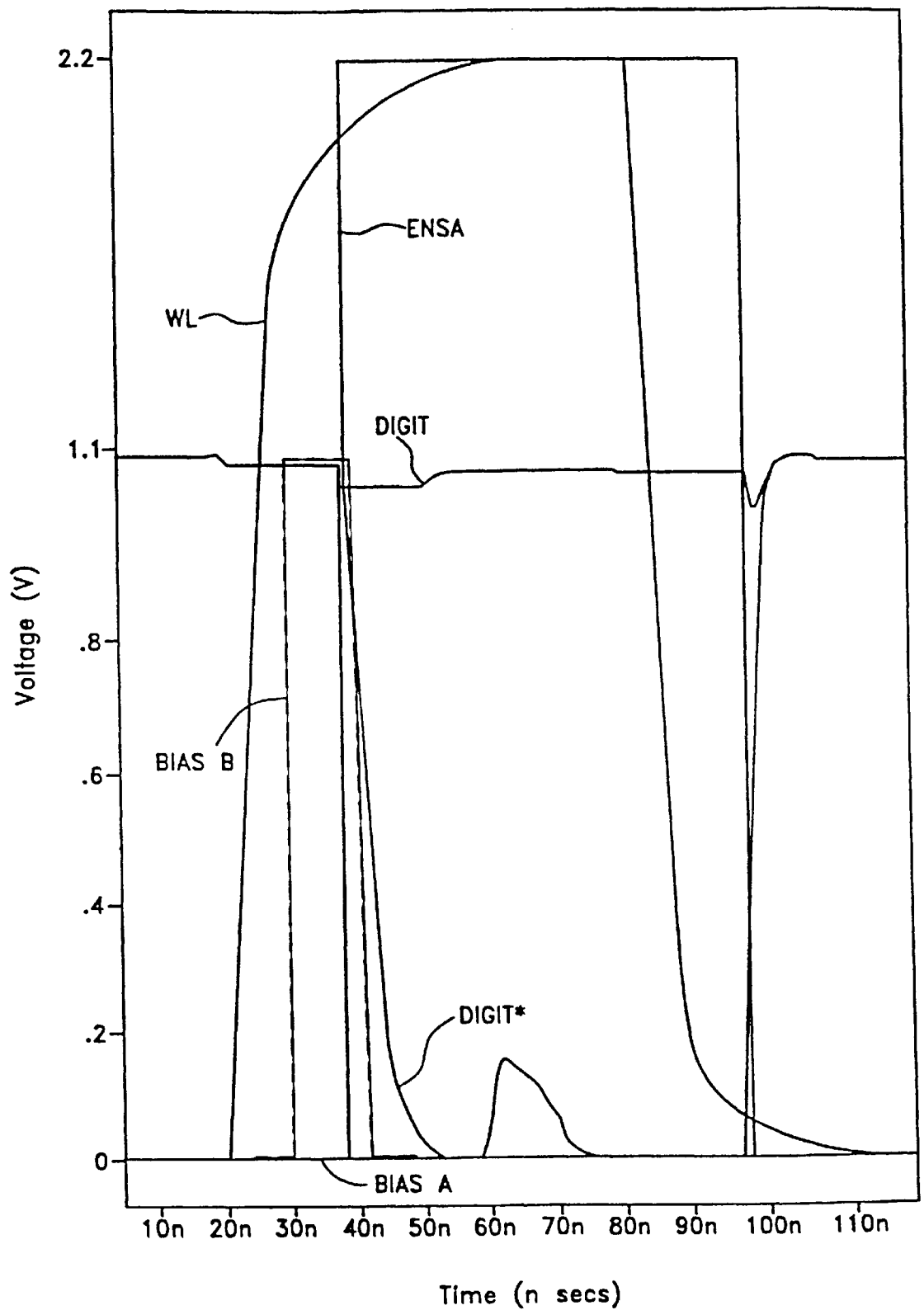
FIG. 4A is a timing diagram illustrating the signal levels of the circuit of FIG. 3 during the reading of a logical "1"
Figure 4B:
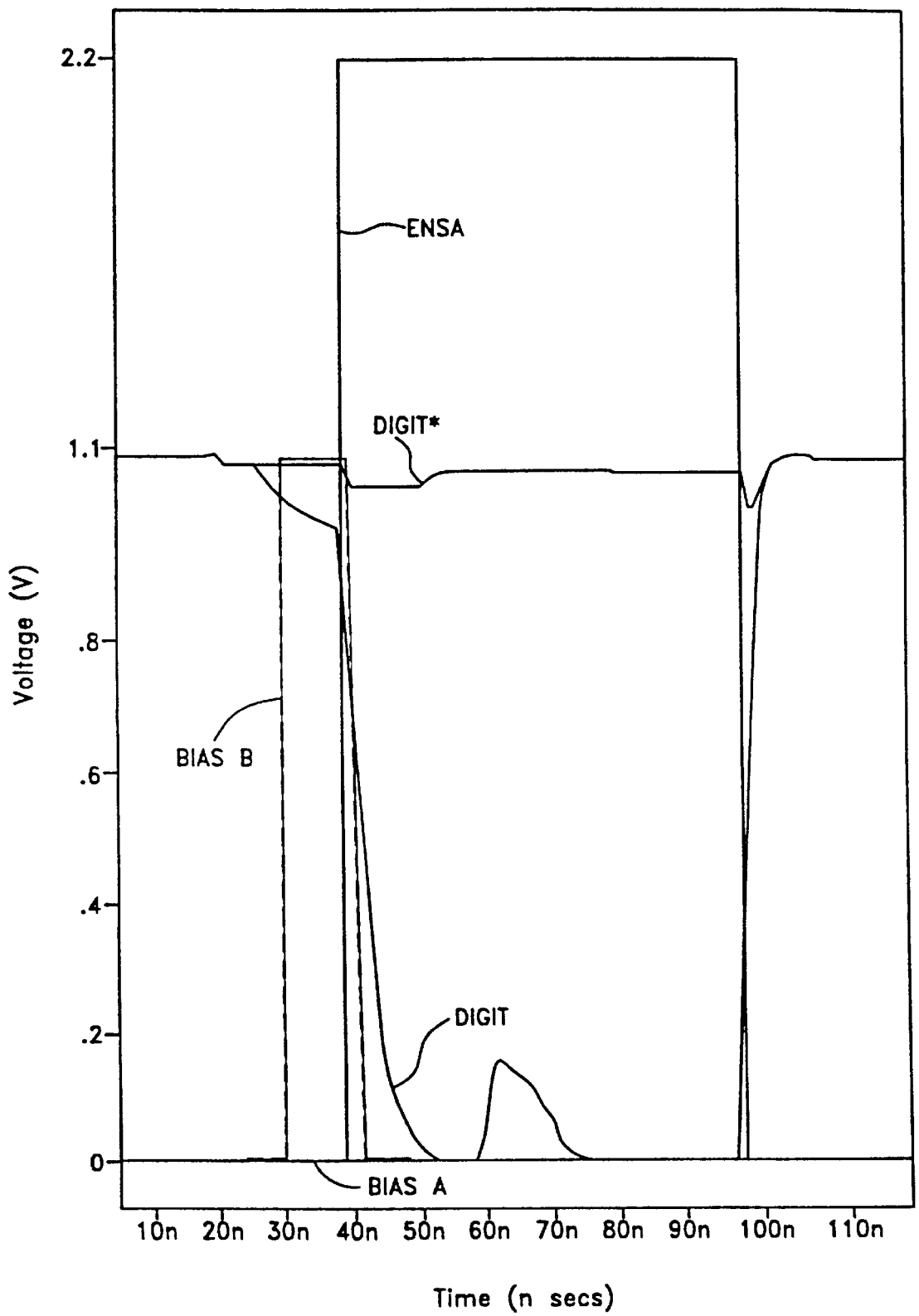
FIG. 4B is a timing diagram illustrating the signal levels of the circuit of FIG. 3 during the reading of a logical "0"

The operation of the circuit 300 in FIG. 3 will now be described with reference to FIGS. 4A and 4B. FIG. 4A is a timing diagram illustrating the signal levels of the circuit 300 during the reading of a logical "1," and FIG. 4B is a timing diagram illustrating the signal levels of the circuit 300 during the reading of a logical "0".

Prior to the reading of the memory cell 354, the digit lines 303 and 306 are set to a reference voltage of DVC2. When the memory cell 354 stores a logical "1," the memory cell 354 is charged to a reduced voltage of $V_{CC}/2$, or DVC2, as opposed to a charge of $V_{CC}$ in the prior art. By storing a logical "1" with a lower voltage, the reliability of the circuit 300 is increased, especially as the gate oxide thickness continue to decrease. Further, using a reduced voltage level on the memory cell 354 limits the static refresh as will be described below.

The memory cell 354 is accessed by the data access circuit 352. The data access circuit 352 detects the input signal WL increasing to approximately $V_{CC}$, or 2.2 volts. By increasing the input signal WL, the transistor 357 is turned on and the charge in the memory cell 354 is connected to the digit line 306 (DIGIT). Because the digit line 306 was precharged to DVC2 and the memory cell 354 had a charge of DVC2, the voltage on the digit line 306 remains substantially constant. Therefore, the digit line 306 still has a voltage approximately equal to the voltage on the digit line 303.

As seen in the timing diagrams of FIG. 4A, shortly after the input WL increases, the input signal BIAS B, which is applied to the gate of the transistor 318, is increased to 1.1 volts, thereby turning on the transistor 318. At this time, the voltage at the node 317 is also at approximately 1.1 volts. Therefore, the voltage of the digit line 303 remains constant at 1.1 volts, or DVC2. While the input signal BIAS B is increased, the input signal BIAS A remains at approximately ground. This ensures that the transistor 315 remains off, thereby isolating the digit line 306 from the voltage on the node 317.

While the input signal BIAS B remains high, the input signal ENSA is raised to 2.2 volts, or $V_{CC}$. Although not shown, the input signal EQ is now at ground. Raising the input signal ENSA turns on the transistor 309, while having the input signal EQ at ground turns off the transistor 312. When the transistor 309 is on, the node 317 is coupled to circuit ground. Because the input signal BIAS B is still high, the transistor 318 remains on connecting the digit line 303 to the node 317, thereby driving the digit line 303 to ground.

As the voltage on the digit line 303 approaches ground, the transistor 324 remains off to continue to isolate the digit line 306 from the node 317. At the same time, the higher voltage on the digit line 306 is connected to the gate of the transistor 327. This voltage turns on the transistor 327 to provide an additional path from the node 317 to the digit line 303. Shortly after the transistor 327 is turned on, the input signal BIAS B is reduced to ground to turn off the transistor 318. Therefore, the digit line 303 is now held at ground through the transistor 327. As can be seen in the timing diagrams, the digit line 303 (DIGIT*) is now at ground, and the digit line 306 (DIGIT) remains at DVC2.

After the voltages on the digit lines 303, 306 stabilize, the input/output circuit 329 accesses the digit lines 303, 306 to provide output signals indicating the charge that was stored in the memory cell 354. The input/output circuit 329 is activated by placing a high voltage at the input signal CSEL. Because the input signal CSEL is connected to the gates of the transistors 330 and 333, having a high voltage input signal CSEL turns on the transistors 330 and 333. When the transistors 330 and 333 are on, the digit line 303 is connected to the output signal IO* and the digit line 306 is connected to the output signal IO. This places the voltage of DVC2 on the output signal IO and ground on the output signal IO*, thus indicating that the memory cell was storing a logical "1". The output signal IO and IO* and then received by additional circuitry (not shown) for further processing.

When the memory cell 354 stores a logical "0," the memory cell 354 stores no charge. The memory cell 354 is again accessed by the data access circuit 352 as described above, and the memory cell 354 is connected to the digit line 306 (DIGIT). Because the memory cell 354 stored no charge, and because the digit line 306 had a charge of DVC2, the voltage on the digit line 306 decreases. Therefore, the digit line 306 now contains a charge lower than the digit line's equilibrium level of DVC2.

As seen in the timing diagrams of FIG. 4B, shortly after the input WL increases, the input signal BIAS B which is applied to the gate of the transistor 318 is increased to 1.1 volts, thereby turning on the transistor 318. At this time, the voltage at the node 317 is also at approximately 1.1 volts. Therefore, the voltage of the digit line 303 remains constant at 1.1 volts, or DVC2. While the input signal BIAS B is increased, the input signal BIAS A remains at approximately ground potential. This ensures the transistor 315 remains off, thereby isolating the digit line 306 from the voltage on the node 317.

While the input signal BIAS B remains high, the input signal ENSA is raised to 2.2 volts, or $V_{CC}$, to turn on the transistor 309. When the transistor 309 is on, the node 317 is coupled to circuit ground. Because the input signal BIAS B is still high, the transistor 318 remains on, thereby coupling the digit line 303 to the node 317 to begin to reduce the charge on the digit line 303. However, shortly after the input signal ENSA is increased, the input signal BIAS B is reduced to ground to turn off the transistor 318, thereby isolating the digit line 303 from the node 317. The digit line 306 remains at a lower voltage than the digit line 303 after the input signal BIAS B returns to ground.

Because the digit line 306 is at a reduced voltage, the transistor 327 is remains off to continue to isolate the digit line 303 from the node 317. At the same time, the higher voltage on the digit line 303 is coupled to the gate of the transistor 324. This voltage turns on the transistor 324 to provide a path from the node 317 to the digit line 306. The digit line 306 is now driven to ground through the transistor 324. As can be seen in the timing diagrams, the digit line 306 (DIGIT) is now at ground, and the digit line 303 (DIGIT*) remains at DVC2.

After the voltages on the digit lines 303, 306 stabilize, the input/output circuit 329 again accesses the digit lines 303, 306 to provide output signals indicating the charge that was stored in the memory cell 354. As discussed above, the input/output circuit 329 is activated by placing a high voltage at the input signal CSEL turns on the transistors 330 and 333. When the transistors 330 and 333 are on, the digit line 303 is coupled to the output signal IO*, and the digit line 306 is coupled to the output signal IO. This places the ground potential on the output signal IO and places a voltage of DVC2 on the output signal IO* thus indicating that the memory cell was storing a logical "0".

After the memory cell 354 has been read and after the output signals are processed, the digit lines 303 and 306 need to be returned to the reference voltage of DVC2 prior to the next memory cell reading. The line equalization circuit 340 returns the digit lines 303 and 306 to the reference voltage of DVC2. To refresh the digit lines 303 and 306, both input signals EQ and PRE EQ are increased to $V_{CC}$. By increasing EQ to $V_{CC}$, a high voltage is applied to the gates of the transistors 342 and 345, thereby turning on the transistors 342 and 345. With PRE EQ at $V_{CC}$, a high voltage is applied to the gate of the transistor 351 to turn on the transistor 351. When the transistor 351 is on, the voltage source of DVC2 is coupled through the transistor 351 and through the transistors 342 and 345 to the digit lines 303 and 306. This quickly pulls whichever digit line 303 or 306 that was at ground back to the reference voltage DVC2. Of course, the other digit line 303 or 306 remains at DVC2. The input signal PRE EQ is then lowered back to ground, thereby turning off the transistor 351. Now the voltage of DVC2 is only connected to the digit lines 303 and 306 through the long-L device of the transistor 348 to limit the current in case row-to-column shorts are present. During a read operation, the input signal EQ is reduced to ground to turn off the transistors 342 and 345 to isolate the line equalization circuit 340 from the digit lines 303 and 306.

By using a reduced voltage for storing a logical "1" in the memory cell 354, the static refresh time of the memory cell may be increased. When a logical "1" is stored as $V_{CC}$, the circuit interprets any voltage from 1.1 volts to 2.2 volts as a logical "1". Voltages below 0.6 volts are interpreted as a logical "0". When the voltage is between 0.7 and 1.0, either a logical "1" or a logical "0" may be read. Therefore, if the memory cell 354 is storing a logical "1", the charge in the memory cell 354 continually bleeds off. The cell must constantly be refreshed to ensure that the charge remains in the area where a logical "1" is read, otherwise known as the ones margin. When a reduced voltage of $V_{CC}/2$ is used to store a logical "1", the circuit interprets any voltage from 0.3 volts to 1.1 volts as a logical "1". Voltages below 0.3 volts are interpreted as a logical "0". The following chart summarizes the data output for each memory cell voltage.

| Cell Voltage | $V_{CC}$ required for logical "1" | $V_{CC}/2$ required for logical "1" |
| --- | --- | --- |
| 2.2 | 1 | — |
| 2.1 | 1 | — |
| 2.0 | 1 | — |
| 1.9 | 1 | — |
| 1.8 | 1 | — |
| 1.7 | 1 | — |
| 1.6 | 1 | — |
| 1.5 | 1 | — |
| 1.4 | 1 | — |
| 1.3 | 1 | — |
| 1.2 | 1 | — |
| 1.1 | 1 | 1 |
| 1.0 | 0 | 1 |
| 0.9 | 0 | 1 |
| 0.8 | 1 | 1 |
| 0.7 | 1 | 1 |
| 0.6 | 0 | 1 |
| 0.5 | 0 | 1 |
| 0.4 | 0 | 1 |
| 0.3 | 0 | 1 |
| 0.2 | 0 | 0 |
| 0.1 | 0 | 0 |
| 0.0 | 0 | 0 |

As can be seen from the chart, the reduced voltage circuit has a 0.8 volt ones margin and a 0.3 volt zeros margin. FIG. 5 is a graph 500 showing the required static refresh times for the normal circuit (line 509) and for the reduced cell voltage circuit (line 515) according to the present invention. The graph 500 measures voltage stored in a memory cell on axis 503 against time on axis 506.

To ensure a proper reading, the memory cell must be refreshed whenever the voltages reaches the threshold level so that a logical "1" may no longer be properly read. As shown in the above chart, this level is when the cell voltage reaches 1.1 volts when $V_{CC}$ is used to store a logical "1", and 0.2 volts when $V_{CC}/2$ is used to store a logical "1". Therefore, the memory cells must be refreshed when the voltage level reaches point 512 on line 509 for the prior art circuit, and when the voltage level reaches point 518 on line 515 in the circuit 300 according to the present invention. As can be seen, the prior art circuit must be refreshed approximately every 7 seconds, while the circuit 300 of the present invention only needs to be refreshed every 14 seconds.

Numerous variations and modifications of the invention will become readily apparent to those skilled in the art. Accordingly, the invention may be embodied in other specific forms without departing from its spirit or essential characteristics. The detailed embodiment is to be considered in all respects only as illustrative and not restrictive and the scope of the invention is, therefore, indicated by the appended claims rather than by the foregoing description. All changes which come within the meaning and range of equivalency of the claims are to be embraced within their scope.

What is claimed is:

1. A circuit using a reduced cell voltage comprising:
   a cell which stores a charge at a first voltage, the charge representing either a logical "1" or a logical "0";
   a first digit line initially biased to a second voltage, the first digit line being coupled to the cell, the first voltage being substantially equal to the second voltage when a logical "1" is stored in the cell;
   a second digit line biased to a third voltage;
   a logic detector which transfers the charge on the cell to the first digit line, the charge on the cell decreasing the second voltage when a logical "0" is stored in the cell and the charge on the cell not substantially changing the second voltage when a logical "1" is stored in the cell; and
   a sense amplifier in electrical communication with the first digit line and the second digit line, the sense amplifier comparing the second voltage to the third voltage to determine the charge stored in the cell.

2. The circuit of claim 1, wherein the first voltage is approximately $V_{CC}/2$ when a logical "1" is stored.

3. The circuit of claim 1, wherein the first voltage is approximately circuit ground when a logical "0" is stored.

4. The circuit of claim 1, wherein the second voltage and the third voltage are initially approximately $V_{CC}/2$.

5. The circuit of claim 1, wherein the sense amplifier is biased to favor a logical "1" if there is no voltage differential between the first digit line and the second digit line.

6. The circuit of claim 1, wherein the sense amplifier comprises a cross-coupled n-channel metal-oxide semiconductor pair.

7. The circuit of claim 1, wherein the sense amplifier drives the second voltage of the first digit line to circuit ground when a logical "0" is detected.

8. The circuit of claim 7, wherein the third voltage of the second digit line remains approximately unchanged.

9. The circuit of claim 1, wherein the sense amplifier drives the third voltage of the second digit line to circuit ground when a logical "1" is detected.

10. The circuit of claim 9, wherein the second voltage of the first digit line remains approximately unchanged.

11. A method of using a reduced cell voltage in a memory cell, the method comprising the steps of:
    storing a logic level in the memory cell at a first voltage for a logical "1" and at a second voltage for a logical "0";
    biasing a first digit line and a second digit line to a reference voltage, the first voltage being substantially equal to the reference voltage;
    transferring the logic level in the memory cell to the first digit line;
    sensing the voltage change of the first digit line; and
    outputting a logical "1" when there is substantially no voltage change on the first digit line or a logical "0" when the voltage on the first digit line decreases.

12. The method of claim 11, wherein the first voltage is approximately $V_{CC}/2$.

13. The method of claim 11, wherein the second voltage is approximately circuit ground.

14. The method of claim 11, wherein the reference voltage is approximately $V_{CC}/2$.

15. The method of claim 11, wherein the voltage change of the first digit line is sensed using a sense amplifier.

16. The method of claim 11, further comprising the steps of:
    detecting an equalization pulse; and
    returning the first digit line and the second digit line to the reference voltage.

17. The method of claim 16, wherein the first digit line and the second digit line are returned to the reference voltage by shorting the first digit line and the second digit line to a voltage source.

18. The method of claim 16, wherein the equalization pulse is applied following the logic output.

19. A memory device using a reduced voltage level in a memory cell to represent a logical "1" comprising:
    a pair of complementary digit lines initially biased to a first voltage level, one of the pair of complementary digit lines being a reference digit line and one of the pair of complementary digit lines being an active digit line;
    a memory access circuit which transfers a charge stored in the memory cell to the active digit line of the pair of complementary digit lines;
    a sense amplifier which detects the voltage level of the pair of complementary digit lines, the sense amplifier maintaining the voltage level of a first of the pair of complementary digit lines at the first voltage level and decreasing the voltage level of a second of the pair of complementary digit lines to a second voltage level; and
    an output which outputs a logical "0" when the first of the pair of complementary digit lines is the reference digit line and outputs a logical "1" when the second of a pair of complementary digit lines is the reference digit line.

20. The memory device of claim 19, wherein the first voltage level is approximately $V_{CC}/2$.

21. The memory device of claim 19, wherein a logical "1" is stored in the memory cell as $V_{CC}/2$.

22. The memory device of claim 19, wherein a logical "0" is stored in the memory cell as circuit ground.

23. The memory device of claim 19, wherein the sense amplifier comprises a cross-coupled n-channel metal-oxide semiconductor pair.

24. A circuit using a reduced cell voltage comprising:
    a cell which stores a charge at a first voltage, the charge representing either a logical "1" or a logical "0";
    a first digit line initially biased to a second voltage, the first digit line being coupled to the cell, the first voltage being substantially equal to the second voltage when a logical "1" is stored in the cell;

a second digit line biased to a third voltage;

means for transferring the charge on the cell to the first digit line, to decrease the second voltage when a logical "0" is stored in the cell and to not substantially change the second voltage when a logical "1" is stored in the cell; and means for comparing the second voltage to the third voltage to determine the charge stored in the cell.

25. The circuit of claim 24, wherein the first voltage is approximately $V_{CC}/2$ when a logical "1" is stored.

26. The circuit of claim 24, wherein the first voltage is approximately circuit ground when a logical "0" is stored.

27. The circuit of claim 24, wherein the second voltage and the third voltage are initially approximately $V_{CC}/2$.

28. The circuit of claim 24, wherein the means for comparing is biased to favor a logical "1" if there is no voltage differential between the first digit line and the second digit line.

29. The circuit of claim 24, wherein the means for comparing comprises a sense amplifier.

30. The circuit of claim 24, wherein the means for comparing drives the second voltage of the first digit line to circuit ground when a logical "0" is detected.

31. The circuit of claim 30, wherein the third voltage of the second digit line remains approximately unchanged.

32. The circuit of claim 24, wherein the means for comparing drives the third voltage of the second digit line to circuit ground when a logical "1" is detected.

33. The circuit of claim 32, wherein the second voltage of the first digit line remains approximately unchanged.

34. A memory device using a reduced voltage level in a memory cell to represent a logical "1" comprising:

a pair of complementary digit lines initially biased to a first voltage level, one of the pair of complementary digit lines being a reference digit line and one of the pair of complementary digit lines being an active digit line;

means for transferring a charge stored in the memory cell to the active digit line of the pair of complementary digit lines;

means for maintaining the voltage level of a first of the pair of complementary digit lines at the first voltage level;

means for decreasing the voltage level of a second of the pair of complementary digit lines to a second voltage level; and means for indicating a logical "0" when the first of the pair of complementary digit lines is the reference digit line and means for indicating a logical "1" when the second of a pair of complementary digit lines is the reference digit line.

35. The memory device of claim 34, wherein the first voltage level is approximately $V_{CC}/2$.

36. The memory device of claim 34, wherein a logical "1" is stored in the memory cell as $V_{CC}/2$.

37. The memory device of claim 34, wherein a logical "0" is stored in the memory cell as circuit ground.

* * * * *